(12) United States Patent
Dias et al.

(10) Patent No.: US 6,812,548 B2
(45) Date of Patent: Nov. 2, 2004

(54) BACKSIDE METALLIZATION ON SIDES OF MICROELECTRONIC DICE FOR EFFECTIVE THERMAL CONTACT WITH HEAT DISSIPATION DEVICES

(75) Inventors: Rajen Dias, Phoenix, AZ (US); Biju Chandran, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/000,229

(22) Filed: Nov. 30, 2001

(65) Prior Publication Data

US 2003/0102526 A1 Jun. 5, 2003

(51) Int. Cl.⁷ .......................................... H01L 23/544
(52) U.S. Cl. .................................. 257/620; 257/712
(58) Field of Search ............................... 257/718, 719, 257/720, 620, 712, 713

(56) References Cited

U.S. PATENT DOCUMENTS 6,008,537 A * 12/1999 Kosaki et al. ............... 257/712

FOREIGN PATENT DOCUMENTS

| EP | 1 085 570 A2 | 3/2001 |
| JP | 57 181133 A | 11/1982 |
| JP | 58 033882 A | 2/1983 |
| JP | 06 013654 A | 1/1994 |
| JP | 06 169015 A | 6/1994 |

* cited by examiner

Primary Examiner—Wael Fahmy
Assistant Examiner—Hoai Pham
(74) Attorney, Agent, or Firm—Rob G. Winkle

(57) ABSTRACT

A microelectronic device and methods of fabricating the same comprising a microelectronic die having an active surface, a back surface, and at least one side. The microelectronic die side comprises a trench sidewall, a lip and a channel sidewall. A metallization layer is disposed on the microelectronic die back surface and the trench sidewall.

13 Claims, 10 Drawing Sheets

BACKSIDE METALLIZATION ON SIDES OF MICROELECTRONIC DICE FOR EFFECTIVE THERMAL CONTACT WITH HEAT DISSIPATION DEVICES

BACKGROUND OF THE INVENTION

1. Field of the Invention

The present invention relates to the backside metallization and dicing of microelectronic device wafers. In particular, the present invention relates to forming a trench extending into the microelectronic device wafer from a back surface thereof prior to metallization and dicing.

2. State of the Art

In the production of microelectronic devices, integrated circuitry is formed in and on semiconductor wafers, which is usually comprised primarily of silicon, although other materials such as gallium arsenide and indium phosphide may be used. As shown in FIG. 8, a single microelectronic device wafer 200 may contain a plurality of substantially identical integrated circuit areas 202, which are usually substantially rectangular and arranged in rows and columns. Two sets of mutually parallel sets of lines or "scribe streets" 204 extend perpendicular to each other over substantially the entire surface of the microelectronic device wafer 200 between each discrete integrated circuit area 202.

After the integrated circuit areas 202 have been subjected to preliminary testing for functionality (wafer sort), the microelectronic device wafer 200 is diced (cut apart), so that each area of functioning integrated circuitry 202 becomes a microelectronic die that can be used to form a packaged microelectronic device. One exemplary microelectronic wafer dicing process uses a circular diamond-impregnated dicing saw, which travels down the scribe streets 204 lying between each of the rows and columns. Of course, the scribe streets 204 are sized to allow passage of a wafer saw blade between adjacent integrated circuit areas 202 without causing damage to the circuitry therein.

As shown in FIGS. 9 and 10, a microelectronic device wafer 200 may have guard rings 206 which substantially surround the integrated circuit areas 202. The guard rings 206 extend though an interconnection layer 208 (see FIG. 10). The interconnection layer 208 comprises layers 212 of metal traces separated by layers of dielectric material layers on a semiconductor wafer 214. The interconnection layer 208 provides routes for electrical communication between integrated circuit components within the integrated circuits. The guard ring 206 is generally formed layer by layer as each layer 212 is formed. The guard ring 206 assists in preventing external contamination encroaching into the integrated circuitry 202 between the layers 212. The microelectronic device wafer 200 also includes a backside metallization layer 216 on a back surface 218 of the semiconductor wafer 214, which will be subsequently discussed.

Prior to dicing, the microelectronic device wafer 200 is mounted onto a sticky, flexible tape 222 (shown in FIG. 10) that is attached to a ridge frame (not shown). The tape 222 continues to hold the microelectronic die after the dicing operation and during transport to the next assembly step. As shown in FIGS. 11 and 12, a saw cuts a channel 220 in the scribe street 204 through the interconnection layer 208, the semiconductor wafer 214, and the backside metallization layer 216. During dicing, the saw generally cuts into the tape 222 to up to about one-third of its thickness. The dicing of the wafer forms individual microelectronic dice 224.

As shown in FIG. 13, a microelectronic die 224 is attached to a substrate 226, such as a motherboard, by a plurality of solder balls 228 extending between interconnection 208 and the substrate 226. A heat dissipation device 232 is attached to the backside metallization layer 216 by a thermal interface material 234. The thermal interface material 234 is usually a solder material including, but not limited to, lead, tin, indium, silver, copper, and alloys thereof. However, it is well known that most solders do not wet (i.e., stick to) semiconductor wafers 214 particularly silicon-based semiconductor wafers). Thus, the backside metallization layer 216 is selected to adhere to the semiconductor wafer back surface 218 and wet with the thermal interface material 234. The backside metallization layer 216 is usually a metal material including, but not limited to, gold, silver, nickel, and the like.

However, in the dicing of microelectronic device wafers 200, dicing saws (metal impregnated with diamond) may cause chipping of the backside metallization layer 216 to expose a portion of the semiconductor wafer back surface 218. Since the thermal interface material 234 does not wet the semiconductor wafer back surface 218, microgaps 236 form between the thermal interface material 234 and the semiconductor wafer back surface 218, and a poor (sagging) thermal interface material fillet 238 results between the heat dissipation device 232 and the backside metallization layer 216, as shown in FIG. 14.

During the operation of the microelectronic die 224 stresses occur at the interface between the backside metallization layer 216 and the thermal interface material 234. These stresses can result in delamination, generally starting at corners/edges 242 of the microelectronic die 224. This delamination results in a decrease in thermal conductivity and moisture encroachment. With a decrease in thermal conductivity comes the risk of overheating in the microelectronic die 224, which can result in the damage or destruction thereof. The microgaps 236 and the poor thermal interface material fillet 238 exacerbate the delamination.

Therefore, it would be advantageous to develop techniques to effectively dice microelectronic device wafers while reducing or substantially eliminating the possibility of delamination propagation.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
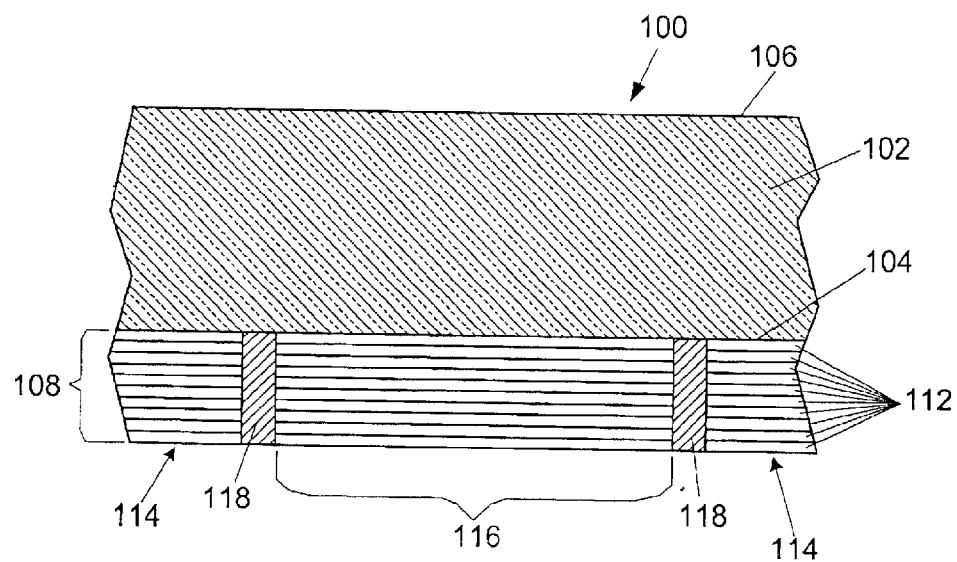
FIG. 1 is a side cross-sectional view of a microelectronic device wafer, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes forming a trench in the back surface of a microelectronic device wafer, opposite scribe streets thereof, prior to backside metallization. When the microelectronic wafer is diced into separate microelectronic dice, the dice channel meets the trench. This results in a microelectronic die structure that greatly reduces or eliminates delamination between the backside metallization and a thermal interface material subsequently applied to form a thermal contact between the microelectronic die and a heat dissipation device.

FIG. 1 illustrates a microelectronic device wafer 100 comprising a semiconductor wafer 102, including, but not limited to, silicon, gallium arsenide and indium phosphide, having an active surface 104 containing the microelectronic device circuitry (not shown) and a back surface 106. The microelectronic device wafer 100 further includes an interconnection layer 108 disposed on the semiconductor wafer active surface 104. The interconnection layer 108 provides routes for electrical communication between integrated circuit components within the integrated circuits. It is, of course, understood that the use of the term "wafer" does not only include an entire wafer, but also includes portions thereof.

The interconnection layer 108 are generally alternating layers 112 of dielectric material, including but not limited to silicon dioxide, silicon carbide, silicon oxy fluoride, carbon doped silicon oxides, silicon nitride, epoxy resin, polyimide, bisbenzocyclobutene, and the like, and layers of patterned electrically conductive material, including copper, aluminum, alloys thereof, and the like. The methods and processes for fabricating the interconnection layer 108 will be evident to those skilled in the art.

Figure 9:
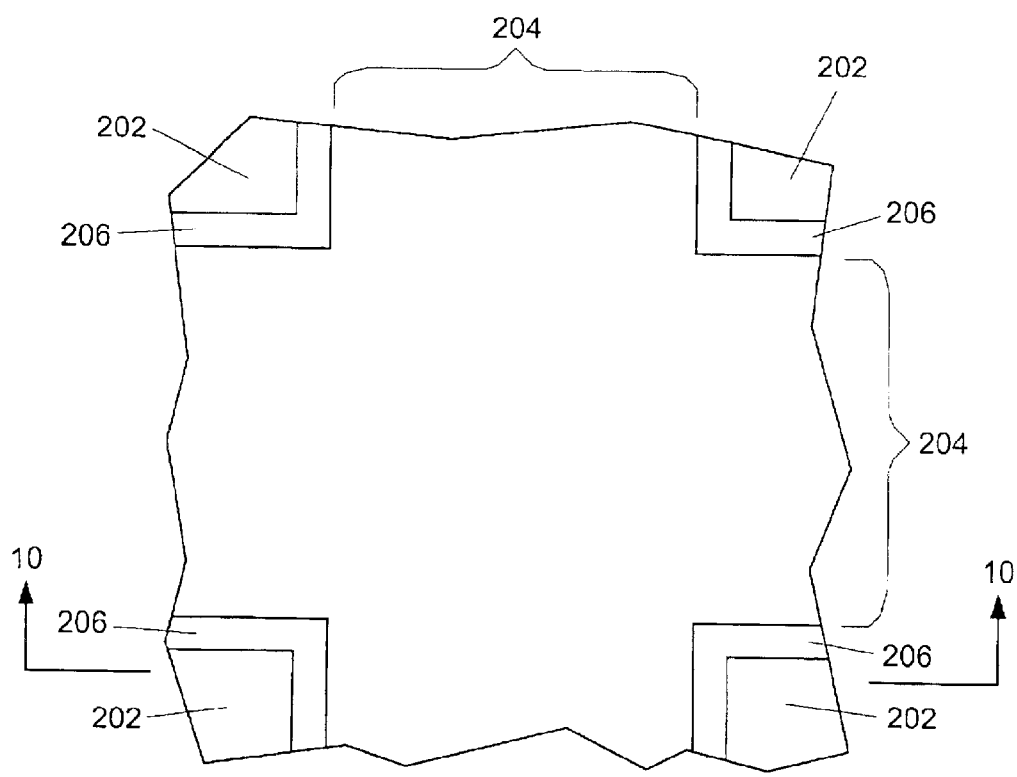
FIG. 9 is a top plan close-up view of insert 9 of FIG. 8 showing the scribe street areas, as known in the art.
Figure 10:
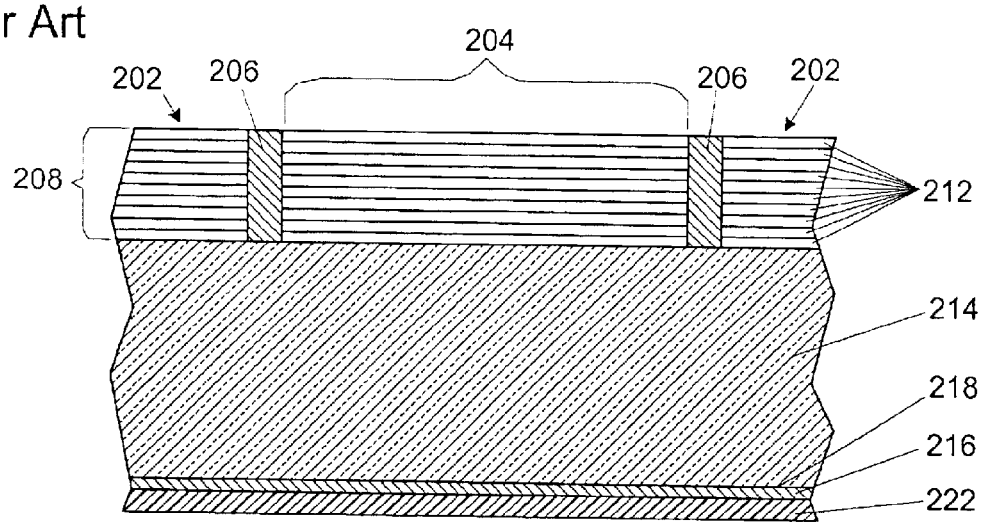
FIG. 10 is a side cross-sectional view of the scribe street areas of a microelectronic device wafer along line 10—10 of FIG. 9, as known in the art.
Figure 11:
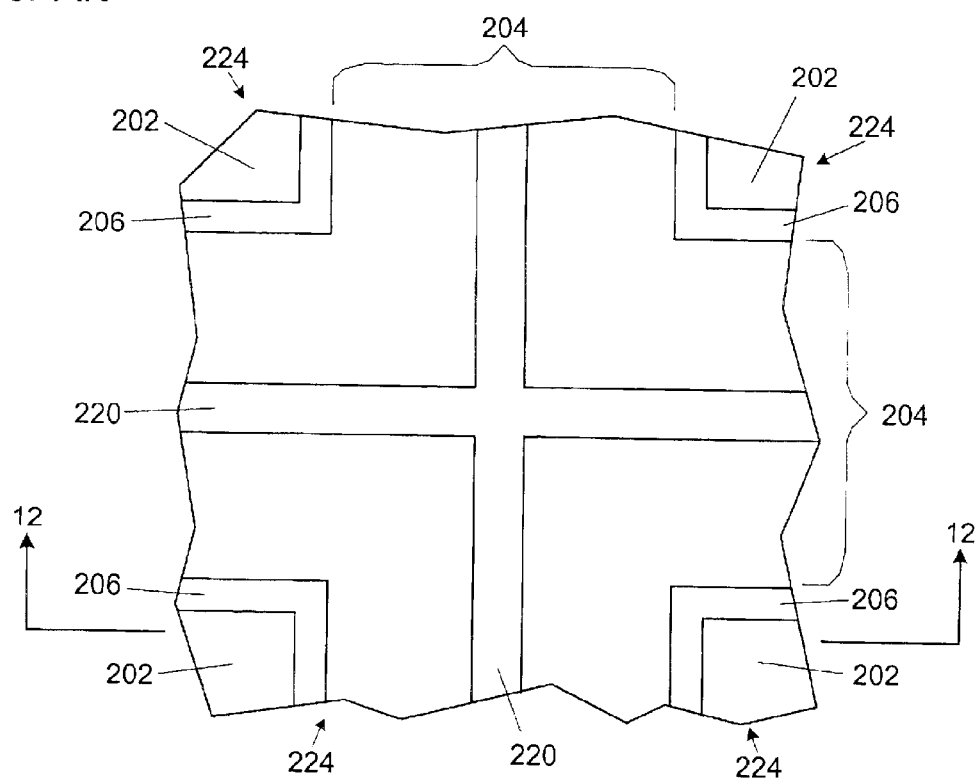
FIG. 11 is a top plan view of the microelectronic device wafer of FIGS. 9 and 10 after wafer dicing, as known in the art.
Figure 12:
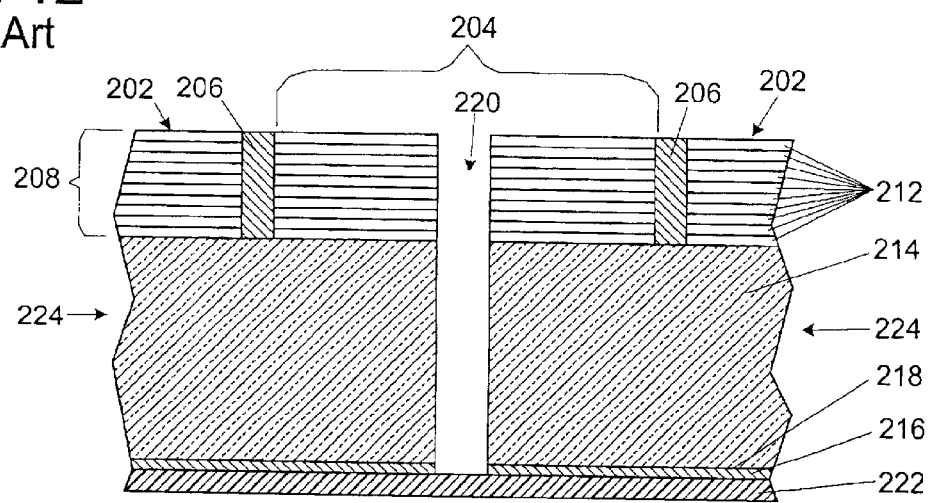
FIG. 12 is a side cross-sectional view of the scribe street areas of the microelectronic device wafer along line 12—12 of FIG. 11, as known in the art.
Figure 13:
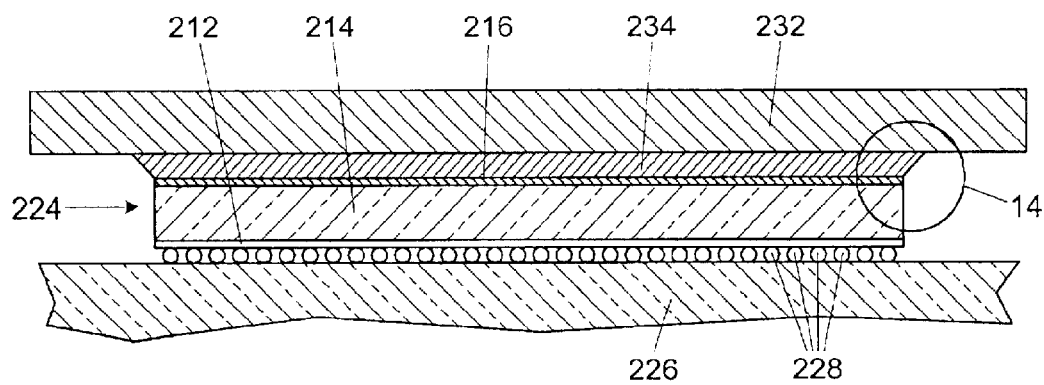
FIG. 13 is a side cross-sectional view of a microelectronic die attached to a substrate and to a heat dissipation device attached to a back surface thereof, as known in the art.
Figure 14:
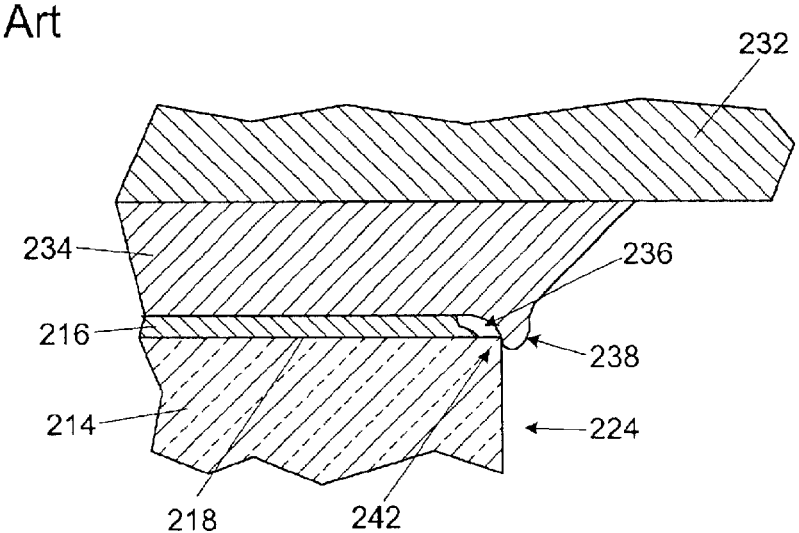
FIG. 14 is a side cross-sectional view of a close-up of insert 14 of FIG. 13, as known in the art.

As previously discussed, a plurality of scribe streets 116 separates the individual integrated circuitry areas 114. Generally the scribe streets 116 run perpendicularly to separate the integrated circuitry areas 114 into rows and columns. Preferably, at least one guard ring 118 isolates integrated circuitry areas 114 from the scribe streets 116, as discussed previously in relation to FIGS. 9 and 10.

Figure 2A:
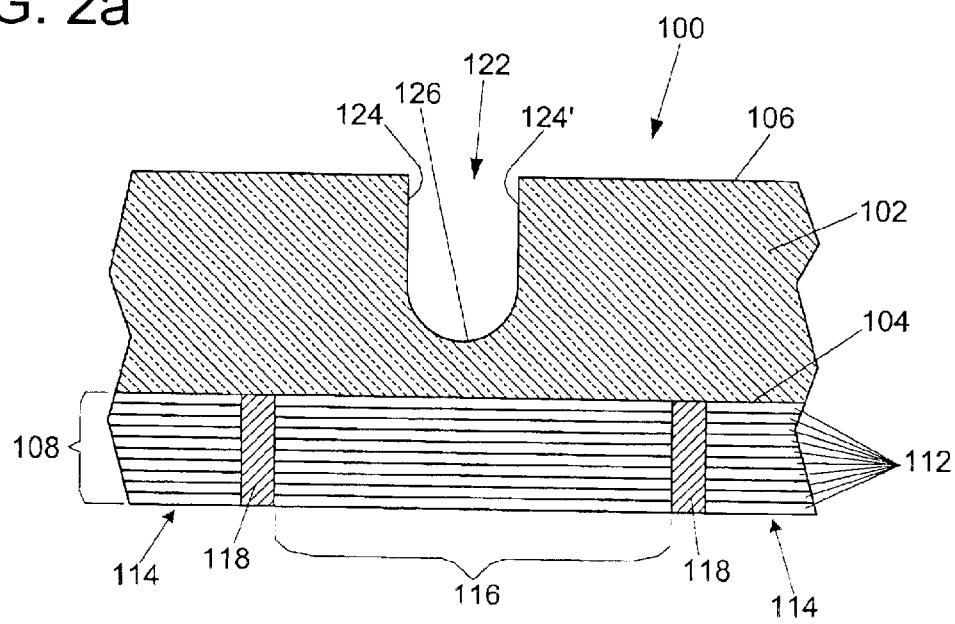
FIGS. 2a–c are side cross-sectional views of trenches formed in the back surface of a microelectronic device wafer opposing a scribe street area thereof, according to the present invention.
Figure 2B:
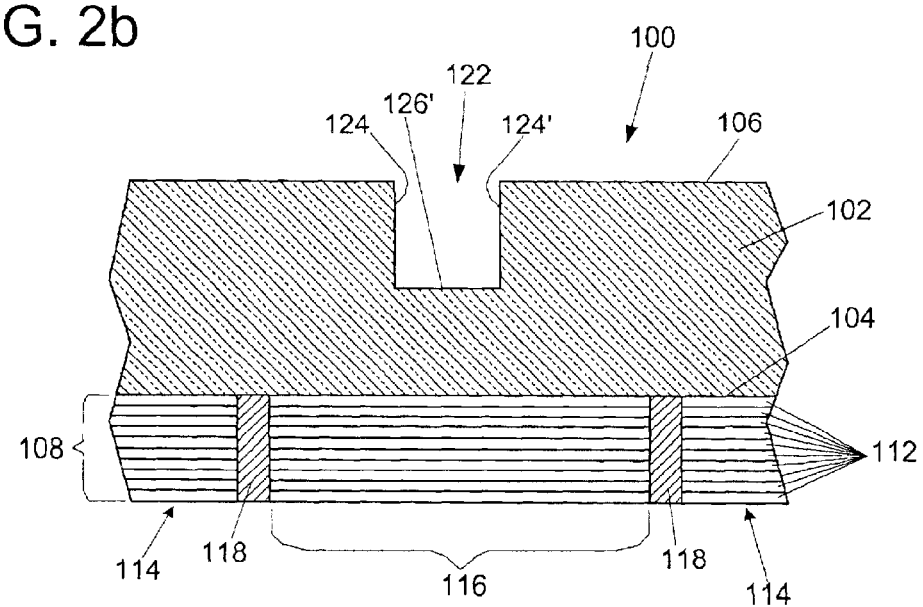
Figure 2C:
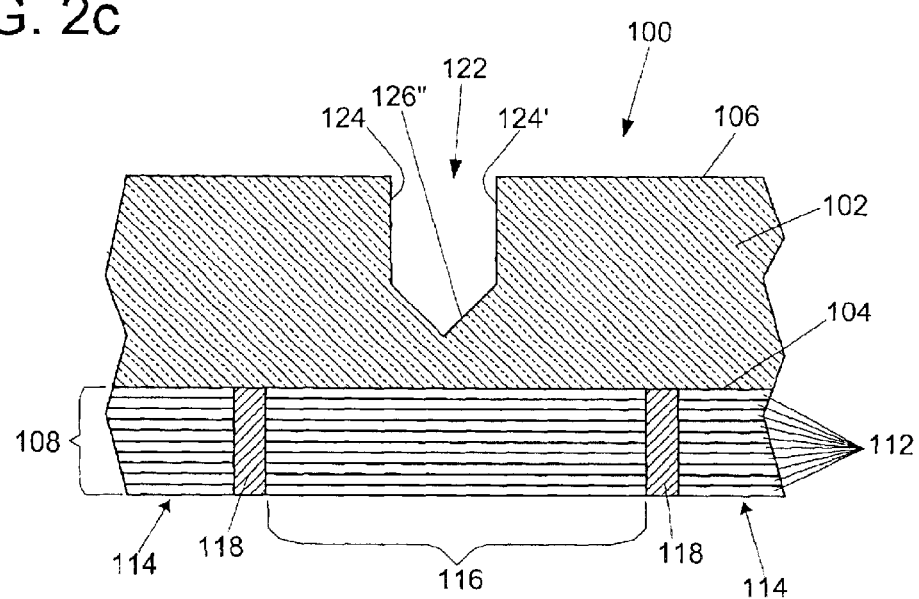

As shown in FIGS. 2a, 2b, and 2c, a trench 122 is formed in the semiconductor wafer back surface 106. The trench 122 may be formed by an technique known in the art, including, but not limited to, laser ablation, laser milling, laser chemical etching, wet and dry etching, reactive ion etching, and preferably by a wafer saw. The trench 122 includes at least two opposing sidewalls 124 and 124' and a substantially arcuate bottom portion 126 (preferred with the radius of curvature equal to one half of the trench width), as shown in FIG. 2a, a substantially flat bottom portion 126', as shown in FIG. 2b, or a substantially angled bottom portion 126", as shown in FIG. 2c. A wafer saw with a diamond impregnated tip is preferred to make the trench cut. A curved wafer saw tip is used to make the bottom of the trench curved, as shown in FIG. 2a. A flat-edged wafer saw tip is used to make the flat bottom portion 126', as shown in FIG. 2b. An angled wafer saw tip is used to make the angled bottom portion 126", as shown in FIG. 2c. The debris generated from the wafer saw may be removed by any cleaning technique known in the art. Preferably, the cleaning technique comprises a water spray followed by a jet of air across the semiconductor wafer back surface 106 and repeated till the debris is removed.

The cuts forming the trenches 122 are made in two orthogonal directions and each cut is centered between scribe lines (i.e., edges of the scribe streets 116 (not shown)) visible from the microelectronic wafer device active side 104. Trench cuts are made on the wafer backside surface. The wafer frontside surface contains the device active circuitry. The trenches are made in two orthogonal directions and each trench cut is centered between the scribe lines visible from the wafer front side.

Figure 3:
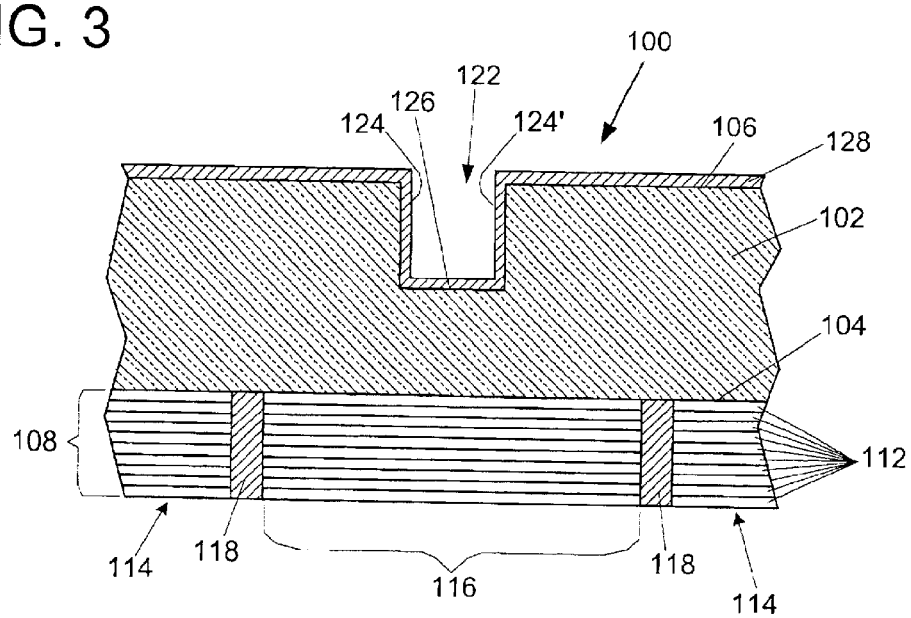
FIG. 3 is a side cross-sectional view of the microelectronic device wafer having a backside metallization layer disposed on a back surface of the semiconductor wafer and the trench, according to the present invention.
Figure 4:
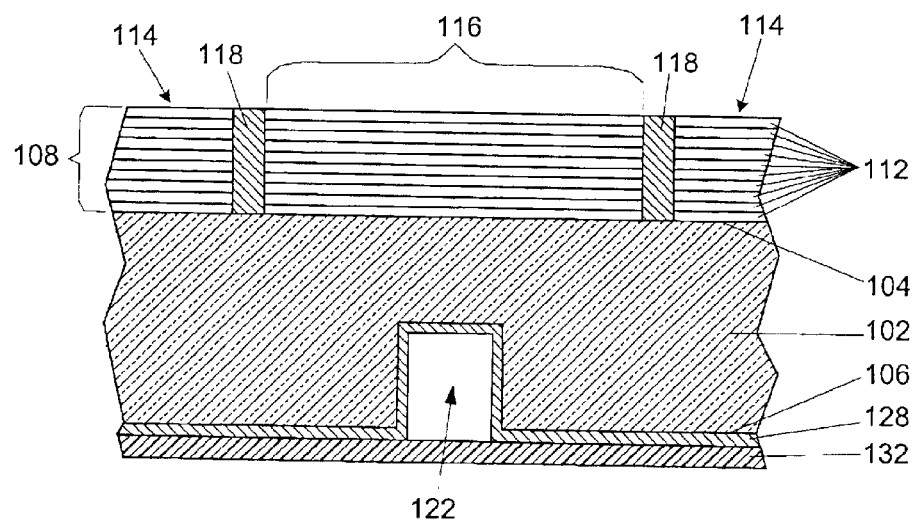
FIG. 4 is a side cross-sectional view of the backside metallization layer of the microelectronic device wafer abutting a dicing tape, according to the present invention.

As shown in FIG. 3, the semiconductor wafer back surface 106 is metallized with a thermally conductive material or materials, including, but not limited to gold, silver, chromium, titanium, tungsten, vanadium, and nickel (nickel vanadium alloy is preferred), to form a backside metallization layer 128. The backside metallization layer 128 may be multiple layers and is formed by any method known in the art, including, but not limited to, chemical vapor deposition, sputter deposition (preferred), plating, and the like. The backside metallization layer 128 may comprise multiple layers of material and preferably comprises a layer of titanium about 500 angstroms thick, a layer of nickel vanadium about 5000 angstroms thick on the titanium layer, and a gold layer about 500 angstroms thick. After the formation of the backside metallization layer 128, a flexible, dicing tape 132 is abutted against the backside metallization layer 128, as shown in FIG. 4.

Figure 5:
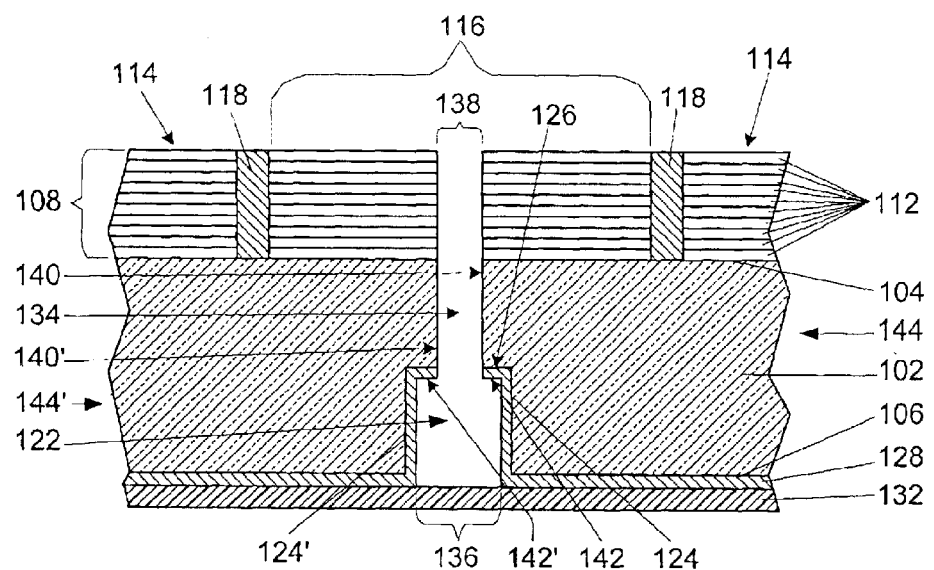
FIG. 5 is a side cross-sectional view of the microelectronic device wafer of FIG. 4 after conventional wafer dicing, according to the present invention.

The microelectronic device wafer 100 is then diced from the semiconductor wafer active surface 104, as shown in FIG. 5, preferably with a standard wafer saw to form dice channel 134 that is substantially perpendicular to the semiconductor wafer active surface 104, thereby singulating individual microelectronic dice 144, 144' from the microelectronic device wafer 100. Preferably, the width 136 of the trench 122 is greater than the width 138 of the dice channel 134 to form a lips 142, 142' from the remaining trench bottom portion 126 (shown in FIGS. 2 and 3). The greater trench width 136 helps prevent cutting into the backside metallization layer 128 on the trench sidewalls 124, 124' when forming the dice channel 134. The trench sidewalls 124 and 124' reside in planes substantially parallel to dice channel sides 140, 140' with lips 142, 142' substantially perpendicular, angled, or curved therebetween, respectively. The wafer saw is preferably centered over the trench 122 prior to the saw process so that the trench lips 142, 142' formed are approximately the same size. Preferably, the dice channel width 138 of the saw cut is about 50 microns.

In a preferred embodiment, the trench 122 is formed to be substantially perpendicular to the semiconductor wafer active surface 104 and the semiconductor wafer bottom surface 106. The trench width 136 can vary between about 40 microns and about 200 microns, but not limited to this range. The trench width 136 is preferably about 80 microns. The trench 122 may have a depth can vary between about 10% to about 80% of the thickness of the semiconductor wafer 102. The depth of the trench 122 is preferably about 50% of the thickness of the semiconductor wafer 102.

Figure 6:
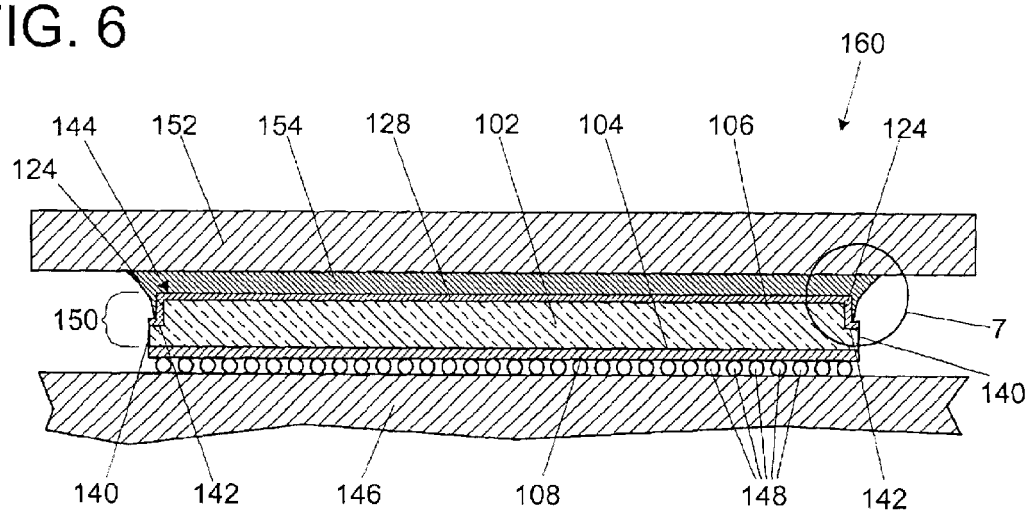
FIG. 6 is a side cross-sectional view of a microelectronic die attached to a substrate and a heat dissipation device attached to a back surface thereof, according to the present invention.

FIG. 6 illustrates a microelectronic device assembly 160, according to the present invention. As shown in FIG. 6, the microelectronic die 144 includes a trench sidewall 124, a lip 142 and a dice channel sidewall 140 which comprise at least one microelectronic die side 150. The microelectronic die 144 is attached to a substrate 146, such as a package substrate or motherboard, by a plurality of solder balls 148 extending between interconnection layer 108 of the microelectronic die 144 and the substrate 146, using flip chip assembly processes known in the art. A heat dissipation device 152 is attached to the backside metallization layer 128 by a thermal interface material 154. The thermal interface material 154 is usually a metal or solder material including, but not limited to, lead, tin, indium (preferred), silver, copper, and alloys thereof. The thickness of the thermal interface material 154 between the heat dissipation device 152 and the backside metallization layer 128 may be between about 25 microns and about 300 microns thick, but is not limited to this range. A preferred thickness range is between about 150 microns and 200 microns.

The attachment of heat dissipation device 152 to the backside metallization layer 128 can be achieved by a number of methods, including, but not limited to the following three methods. First and preferred, the thermal interface material 154, in a thin preformed structure, is sandwiched between the heat dissipation device 152 and the backside metallization layer 128 and held together with a clamp. The clamped assembly is sent through a solder reflow oven where the thermal interface material 154 melts and forms a solid-state bond with the heat dissipating device 152 and the backside metallization layer 128 including the portion of the backside metallization layer 128 along the trench sidewall 124 and the lip 142. In a second method, the thermal interface material 154 is pre-applied to the heat dissipation device 152 by solder reflow. The heat dissipating device 152 is then placed on the backside metallization layer 128 and held together with a clamp. The clamped assembly is sent through a solder reflow oven where the thermal interface material 154 melts and forms a solid-state bond with the backside metallization layer 128 including the portion of metallization layer 128 along the trench sidewall 124 and the lip 142. In a third method, the thermal interface material 154 is pre-applied to the backside metallization layer 128 by solder reflow. The heat dissipation device 152 is then placed on the thermal interface material 154 and held together with a clamp. The clamped assembly is sent through a solder reflow oven where the thermal interface material 154 melts and forms a solid-state bond with the backside metallization layer 128 including the portion of metallization layer 128 along the trench sidewall 124 and the lip 142.

Figure 7A:
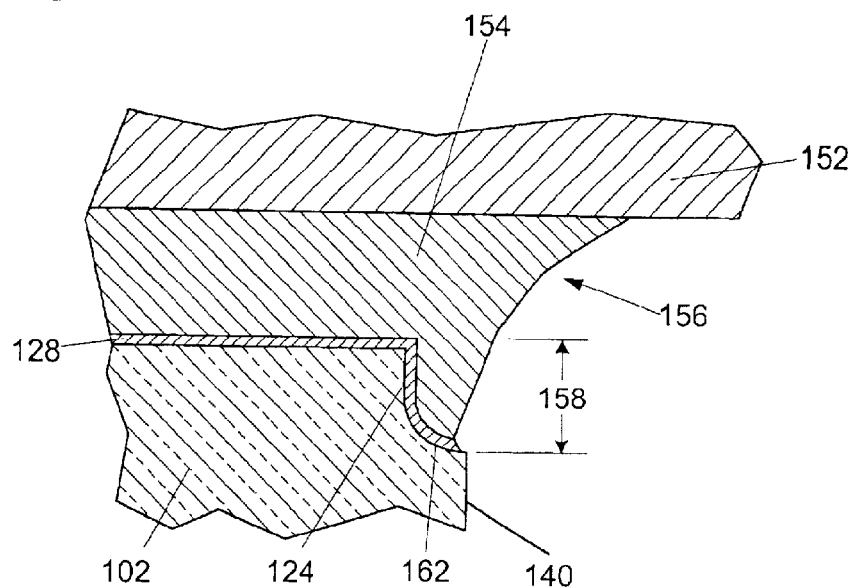
FIGS. 7a–c are side cross-sectional views of a close-up of insert 7 of FIG. 6, according to the present invention.
Figure 7B:
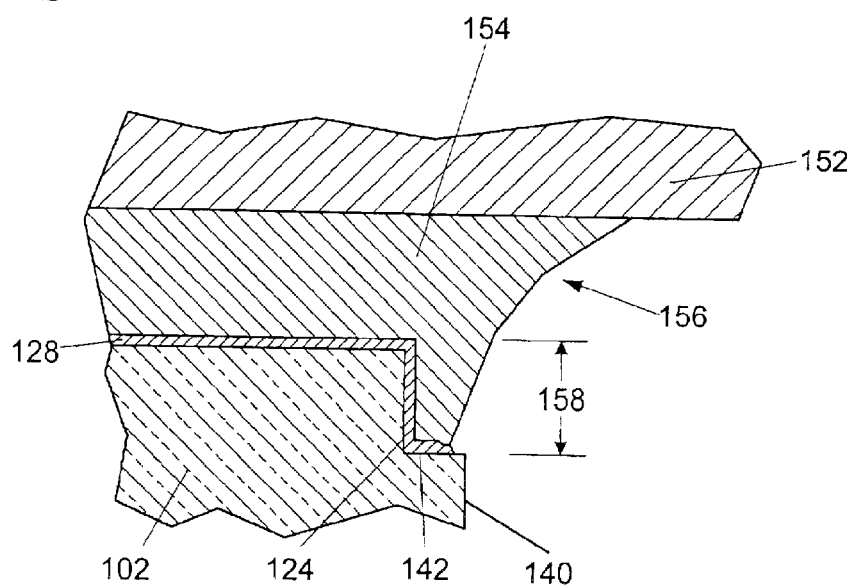
Figure 7C:
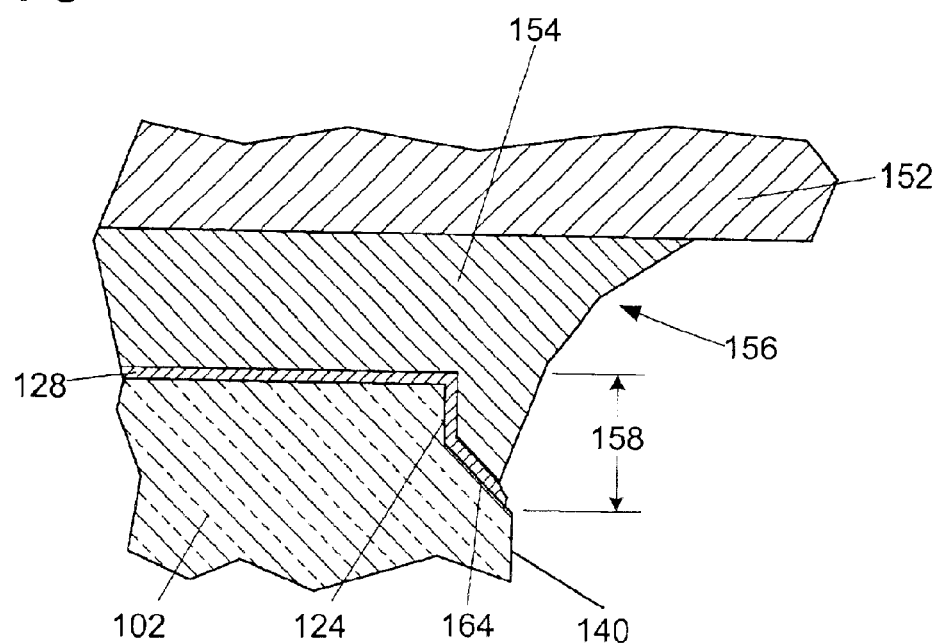
Figure 8:
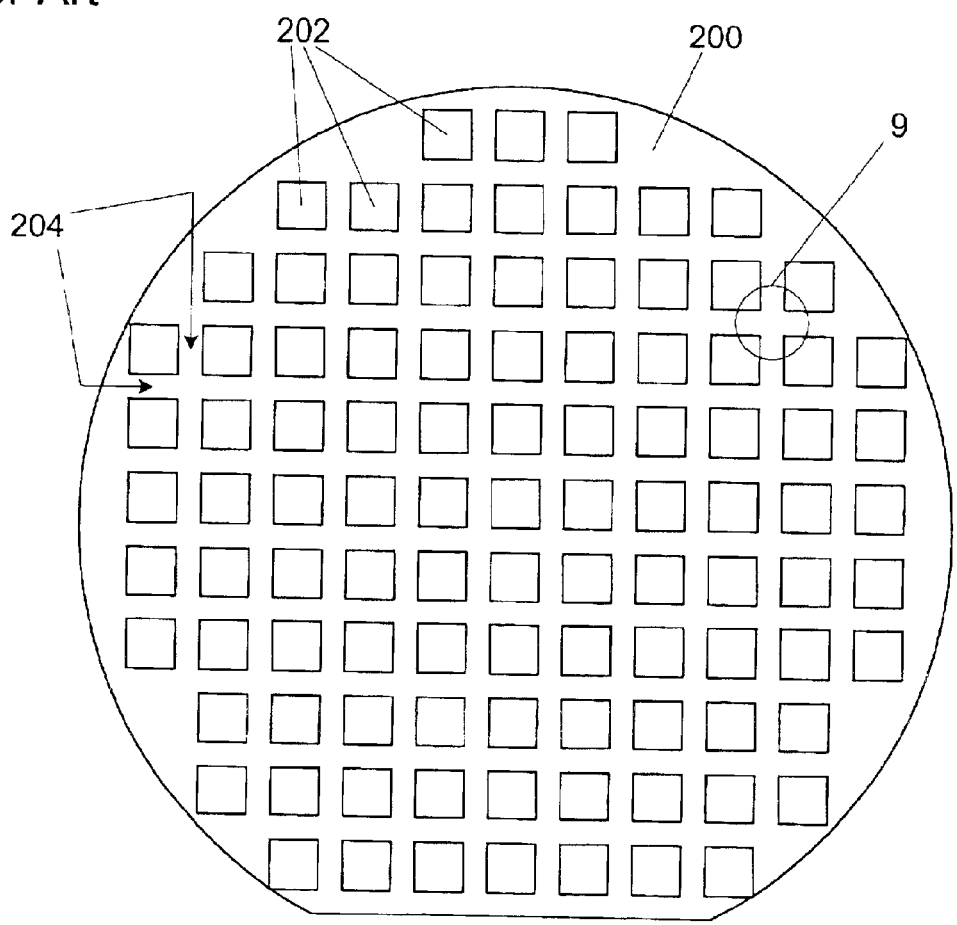
FIG. 8 is a top plan view of a conventional microelectronic device wafer having a plurality of unsingulated microelectronic devices, as known in the art.

During the attachment of the heat dissipation device 152 with the thermal interface material 154, the thermal interface material 154 wets and wicks up the backside metallization layer 128 on the trench sidewalls 124 to form a favorable fillet 156, as shown in FIGS. 7a–c, which extends between the backside metallization layer 128 on the trench sidewall 124 and the heat dissipation device 152. The backside metallization layer 128 on the trench sidewalls 124 will result in a predictable fillet 156. The fillet 156 is predictable due to the fact that the depth 158 of the trench may be adjusted depending on the thermal interface material 154 that is used, as will be understood by those skilled in the art. Preferably, the fillet 156 will extend down the backside metallization layer 128 on the trench sidewalls 124 with minimal contact with the backside metallization layer 128 on the lip 142. Thus, as any chipping and semiconductor wafer 102 exposure will be limited to the backside metallization layer 128 on the lip 142, the thermal interface material layer 154 generally will not contact such defects. Therefore, the stresses on the thermal interface material layer 154 caused by such defects are greatly reduced or eliminated, which in turn greatly reduces or eliminates delamination of the thermal interface material 154. FIG. 7a illustrates an arcuate lip 162 (see FIG. 2a). FIG. 7b illustrates a flat lip 142 (see FIG. 2b). FIG. 7c illustrates an angled lip 164 (see FIG. 2c).

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic device, comprising:
   a microelectronic die having an active surface, a back surface, and at least one side;
   said at least one microelectronic die side comprising at least one trench sidewall, at least one lip and at least one channel sidewall, said at least one trench sidewall residing in a plane substantially parallel to said at least one channel sidewall; and
   a metallization layer disposed on said microelectronic die back surface and said at least one trench sidewall.

2. The microelectronic device of claim 1, wherein said at least one lip is substantially perpendicular to at least one of said at least one trench sidewall and at least one channel sidewall.

3. The microelectronic device of claim 1, wherein said at least one lip is substantially angled to at least one of said at least one trench sidewall and at least one channel sidewall.

4. The microelectronic device of claim 1, wherein said at least one lip is substantially curved to at least one of said at least one trench sidewall and at least one channel sidewall.

5. The microelectronic device of claim 1, wherein said metallization layer is at least one metal selected from the group consisting of gold, silver, titanium, chromium, vanadium, tungsten, and nickel.

6. A microelectronic device assembly, comprising:
- a microelectronic die having an active surface, a back surface, and at least one side;
- said at least one microelectronic die side comprising at least one trench sidewall, at least one lip, and at least one channel sidewall;
- a metallization layer disposed on said microelectronic die back surface and said at least one trench sidewall; and
- a heat dissipation device attached to said microelectronic die back surface with a thermal interface material.

7. The microelectronic device assembly of claim 6, wherein said at least one trench sidewall is substantially planar to said at least one channel sidewall.

8. The microelectronic device assembly of claim 7, wherein said at least one lip is substantially perpendicular to at least one of said at least one trench sidewall and at least one channel sidewall.

9. The microelectronic device of claim 7, wherein said at least one lip is substantially angled to at least one of said at least one trench sidewall and at least one channel sidewall.

10. The microelectronic device of claim 7, wherein said at least one lip is substantially curved to at least one of said at least one trench sidewall and at least one channel sidewall.

11. The microelectronic device assembly of claim 6, wherein said metallization layer is at least one metal selected from the group consisting of gold, silver, titanium, chromium, vanadium, tungsten, and nickel.

12. The microelectronic device assembly of claim 6, wherein said thermal interface material is selected from the group consisting of lead, tin, indium, silver, copper, and alloys thereof.

13. The microelectronic device assembly of claim 6, wherein at least a portion of a fillet of said thermal interface material extend from said metallization layer on said microelectronic die trench sidewall to said heat dissipation device.

* * * * *